United States Patent [19]

Omata et al.

[11] Patent Number: 4,764,791
[45] Date of Patent: Aug. 16, 1988

[54] WORK ALIGNMENT APPARATUS FOR DOUBLE-SIDED EXPOSURE OF A WORK

[75] Inventors: Tadao Omata; Naoshi Kozu, both of Tokyo, Japan

[73] Assignee: ORC Manufacturing Co., Ltd., Tokyo, Japan

[21] Appl. No.: 84,872

[22] Filed: Aug. 13, 1987

[30] Foreign Application Priority Data

Aug. 13, 1986 [JP] Japan ................. 61-190341

[51] Int. Cl.⁴ .............. G03B 27/32; G03B 27/52
[52] U.S. Cl. ........................... 355/26; 355/72; 355/99; 355/53
[58] Field of Search ............ 355/26, 99, 53, 72, 355/23, 24

[56] References Cited

U.S. PATENT DOCUMENTS

| | | | |
|---|---|---|---|
| 4,389,115 | 6/1983 | Richter | 355/26 |
| 4,565,443 | 1/1986 | Yazaki | 355/26 |
| 4,614,425 | 9/1986 | Copeland et al. | 355/26 |
| 4,721,980 | 1/1988 | Yazaki | 355/26 |

*Primary Examiner*—Monroe H. Hayes
*Attorney, Agent, or Firm*—Cushman, Darby & Cushman

[57] ABSTRACT

Disclosed is a work alignment apparatus for double-sided exposure of a work which serves to convey to and locate the work in an exposing position such that the work is exposed on either side thereof between printing frames each holding an image mask on each corresponding side of the work. The work alignment apparatus comprises means for detecting and calculating an amount of misalignment between the work in the exposing position and each of the image masks, an alignment stage disposed outside the printing frames and adapted to determine a mounting position of the work in an alignment coordinate system in accordance with the misalignment, and means for conveying the work, in the mounting position located in the alignment coordinate system, to the exposing position.

1 Claim, 2 Drawing Sheets

WORK ALIGNMENT APPARATUS FOR DOUBLE-SIDED EXPOSURE OF A WORK

BACKGROUND OF THE INVENTION 1. (Field of the Invention)

The present invention relates to a work alignment apparatus for double-sided exposure of a work, such as a printing board, adapted to align image masks and the work when two opposite sides of the work are exposed simultaneously to images of printed wiring or the like.

2. (Description of the Prior Art)

In printing a predetermined image, such as a wiring pattern, on a work, e.g., a printing board, by exposure, mask films are located close to and in alignment with the work and parallel beams of light are applied to the work through the mask films. "A method of printing on a printing board" is disclosed in Japanese Patent Application No. 055708/61 filed on Mar. 13, 1986 by the inventor hereof. This prior art method is associated with a method of aligning upper and lower surface mask films and a work, such as a printing board, before simultaneously exposing both sides of the work. In this method of alignmemt between the work and the mask films for the simultaneous double-sided exposure, the work is first set in an exposing position. Then, a printing frame which holds the upper-surface mask film is positioned with respect to the work by viewing reference marks for positioning on the work and the mask films. Thereafter, a printing frame which holds the lower-surface mask film is positioned in the same manner as the first or upper printing frame.

According to the prior art method described above, however, alignment mechanisms must be provided individually for the upper- and lower-surface mask films. These mechanisms adjust the positions of the mask films with respect to two directions (X- and Y-directions) which intersects at right angles on a plane and with respect to a rotational direction ($\theta$-direction) of the plane in accordance with misalignments between the reference marks on the printing board and the mask films. Thereafter, the mask films, along with the alignment mechanism itself, must be brought in position close to the printing board with high accuracy, thus requiring a highly complicated arrangement. This causes a high cost. Further, the use of the separate alignment mechanisms for the two upper- and lower-surface mask films, as well as the complicated arrangement thereof, entails a substantial increase in cost of the apparatus.

SUMMARY OF THE INVENTION

The present invention has been made in view of the above-mentioned prior art problems, and the object thereof is to provide a work alignment apparatus in which an alignment mechanism for simultaneous double-sided exposure of a work is simplified in construction, thus permitting reduction in cost of the apparatus.

In order to attain the above object, according to the present invention, there is provided a work alignment apparatus for double-sided exposure of a work which serves to convey to and locate the work in an exposing position such that the work is exposed on either side thereof between printing frames each holding an image mask on each corresponding side of the work, the apparatus comprising means for detecting and calculating an amount of misalignment between the work in the exposing position and each of the image masks, an alignment stage disposed outside the printing frames and adapted to determine a mounting position of the work in an alignment coordinate system in accordance with the calculated amount of misalignment, and means for conveying the work, in the mounting position determined in the alignment coordinate system, to the exposing position.

The work is set each time at the same mounting position on the alignment stage, and is conveyed accurately to the exposing position by the conveyance means. Accordingly, the possibility of adjusting to align the position of the work at the mounting position as required according to the amount of the misalignment of the preceding work at the exposing position enables the alignment of the work with the image masks (hereinafter referred to simply as works) to be performed outside the printing frames. The upper- and lower-surface masks are beforehand aligned so that they are ready to approach each other for exposure. The above-mentioned function and construction according to the present invention eliminate the necessity of two independent upper and lower alignment mechanisms for the printing frames, enabling the single alignment mechanism (alignment stage) disposed outside the printing frames to align the work and masks. Further, the elimination of the necessity of the up and down movements of the alignment stage makes the alignment mechanism to be simplified in construction.

DESCRIPTION OF THE PREFERRED EMBODIMENT

An embodiment of the present invention will now be described with reference to the accompanying drawings.

Figure 1:
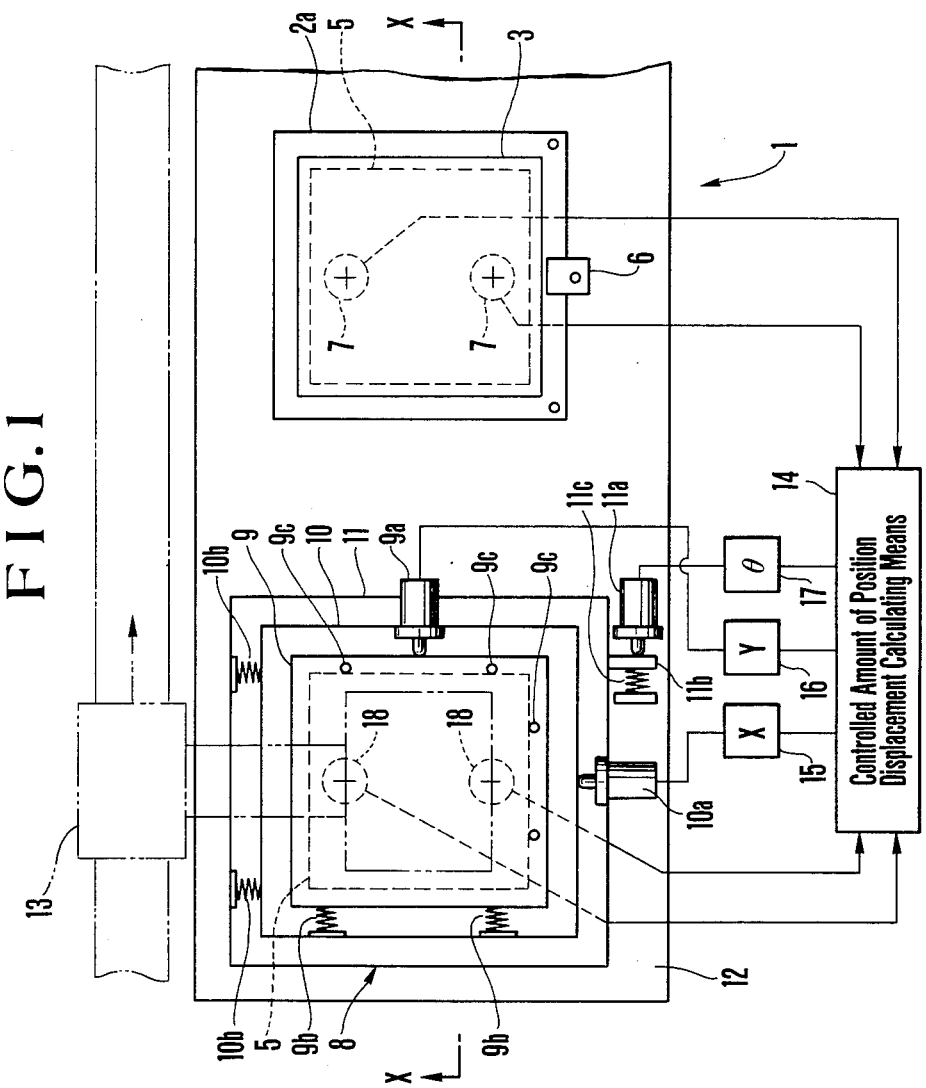
FIG. 1 is a top view of an apparatus according to an ambodiment of the present invention, including a block diagram of a control system for the apparatus.
Figure 2:
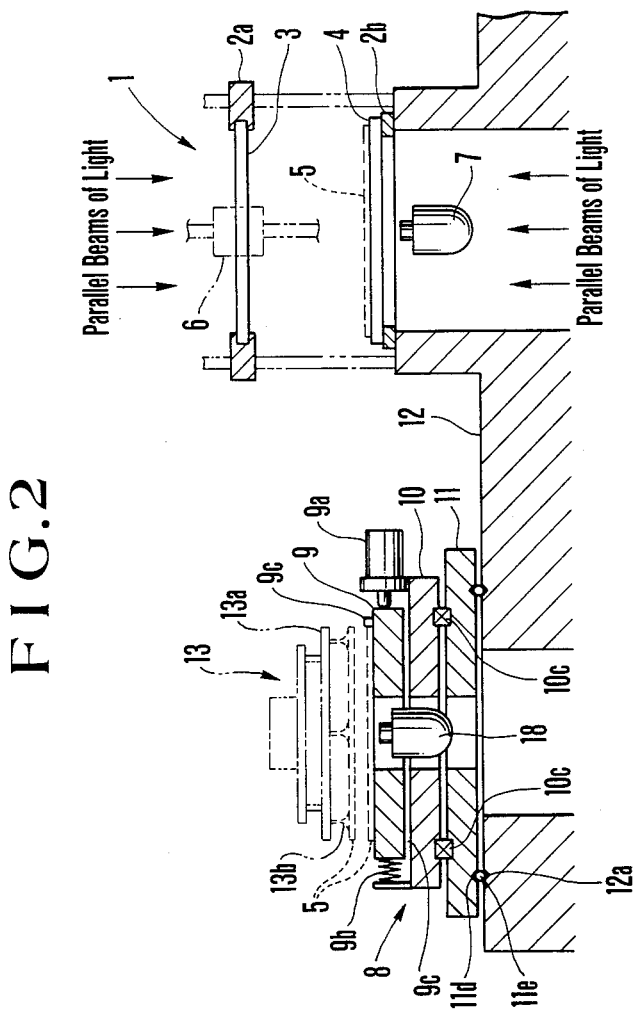
FIG. 2 is a sectional view taken along line X—X of FIG. 1.

FIG. 1 is a top view of a work alignment apparatus according to an embodiment of the present invention, including a block diagram of a control system for the apparatus, and FIG. 2 is a sectional view taken along line X—X of FIG. 1. First, the arrangement of the apparatus will be described. Reference numeral 1 denotes a simultaneous double-sided exposure unit, which serves to transfer a work 5, such as a printing board, to an exposing position between upper- and lower-surface masks 3 and 4, which are held by printing frames 2a and 2b, respectively. In this exposure unit, the work 5 is brought into intimate contact with or close to, for example, the lower-surface mask 4 by using vacuum suction means (not shown) or the like, and is held in position. The upper-surface mask 3, on the other hand, is brought into intimate contact with or close to the work 5 by means of a vertical motion mechanism 6 of the upper printing frame 2a. The masks 3 and 4 are each composed of a glass member or a composite member which is formed by depositing a mask film on a plate of glass or resin, such as acrylic resin, by adsorption. When they are joined together or brought close to each other in the aforesaid manner, the upper- and lower-surface masks 3 and 4 are set so that their respective reference marks for alignment are in alignment with one another. The alignment is confirmed periodically by automatic or manual operation using television cameras 7. In case of misalignment, the masks 3 and 4 are reset. The television cameras 7 serve also as sensors for calculating a dislocation between reference marks on the work 5 and those on the lower-surface mask 4.

Outside the printing frames 2a and 2b, there is an alignment stage 8 on which the work is located in a predetermined position before it is exposed. The alignment stage 8 is composed of an X-table 9, a Y-table 10, and a θ-table 11. The X- and Y-tables 9 and 10 are moved, respectively, in X- and Y-directions which cross each other at right angles on a plane. The θ-table 11 is used to rotate the X- and Y-tables 9 and 10 on the plane. The X-table 9 is mounted on the Y-table 10 by means of slide bearings 9c or the like so as to be slidable in the X-direction. X-table moving means 9a is provided at one side parallel with the Y-axis of the Y-table 10. The moving means 9a causes to move back and forth by a specified distance in the X-direction by means of a pulse motor or the like. X-table urging members 9b are arranged at the opposite side parallel with the Y-axis of the Y-table 10. The urging members 9b serve to urge the X-table 9 in a direction such that the X-table moving means 9a retreats. With this arrangement, the X-table 9 is positioned with respect to the X-direction. The Y-table 10 is mounted on the θ-table 11 by means of slide bearings 10c or the like so as to be slidable in the Y-direction. Y-table moving means 10a is provided at one side parallel with the X-axis of the θ-table 11. The moving means 10a causes to move back and forth by a specified distance in the Y-direction by means of a pulse motor or the like. Y-table urging members 10b are arranged at the opposite side parallel with the X-axis of the θ-table 11. The urging members 10b serve to urge the Y-table 10 in a direction such that the Y-table moving means 10a retreats. With this arrangement, the Y-table 10 is positioned with respect to the Y-direction. A V-shaped groove 12a is formed in a circle on that portion of a base 12 of the exposure unit 1 under the θ-table 11. Also, a V-shaped groove 11d is formed in a circle of the same diameter as the groove 12a, on the lower surface of the θ-table 11. The θ-table 11 is placed on the base 12 so that their grooves 11d and 12a wholly overlap each other, and ball bearings 11e are arranged between the grooves so taht the table 11 is rotatable. θ-table moving means 11a is provided on the base 12. The moving means 11a causes to move back and forth by a specified distance in the rotational direction of the θ-table 11 by means of a pulse motor or the like. The θ-table moving means 11a serves to move a lug 11b which is fixed to the peripheral edge portion of the θ-table 11. The lug 11b is urged in the retreating direction of the moving means 11a by a θ-table urging member 11c which is provided on the base 12. With this arrangement, the θ-table 11 is rotated by a specified angle θ in the predetermined direction. The mechanisms for shifting the individual tables are not limited to the arrangements described above, and may be replaced with any other suitable means, such as combinations of screw and nuts.

Conveyance means 13 will now be described. Before exposure, the work 5, restricted by positioning pins 9c suitably arranged on the X-table 9, is located in a fixed mounting position for each occasion. The work 5 may be mounted with use of the conveyance means 13 or any other suitable means for the purpose, such as a conveyor, robot, handler, etc. The conveyance means 13 is an example of the handler, which includes a suction plate 13a and a suitable number of vacuum suction nozzles 13b thereon. The conveyance means 13 lowers so that the nozzles 13b seize the work 5 on the X-table 9 by vacuum suction, and then rises up to a predetermined height. Thereafter, the conveyance means 13 moves horizontally to convey the work 5 to an exposing position between the printing frames. At this time, the upper printing frame 2a is retreated upward, so that the conveyance means 13 lowers and leaves the work 5 in the exposing position. Subsequently, the conveyance means 13 rises up again to the outside of the printing frames, and then lowers for exposure. The conveyance means 13 is not limited to the aforementioned arrangement, and may be composed of any other suitable mechanism, such as a robot, conveyor, etc., depending on the type of the work.

The arrangement of the control system will now be described. The control system includes television cameras 7 and 18, controlled-amount-of-position-displacement calculating means 14, and X-, Y-, and θ-drive units 15, 16 and 17. The cameras 7 are used to obtain image information on misalignment from the respective reference marks on the work and the masks held by the printing frames. The cameras 18 are arranged at the base 12, below the upper surface of the X-table 9, and are used to obtain image information for the measurement of the absolute position of the work 5 in the mounting position on the X-table 9, with respect to the alignment coordinate system. The calculating means 14 calculates an amount of misalignment between the work and each mask on the basis of the misalignment information, and then calculates specified amounts of displacement and specified angles for the correction of the respective positions of the tables, on the basis of the calculated value. The drive units 15, 16 and 17 serve to apply predetermined numbers of pulses to their corresponding moving means 9a, 10a and 11a in accordance with the specified amounts of displacement and the specified angles. For the measurement of the absolute position, the television cameras 7 and 18 are fixed to the base 12. The number of television cameras used is not limited to any specific number. If they are microscopic cameras, however, two or more cameras are preferably provided for each set. The cameras 7 and 18 and the calculating means 14 constitute means for detecting and calculating misalignment according to the present invention.

The operation of the apparatus thus constructed will now be described. The work mounting position on the alignment stage 8 is controlled by means of the alignment coordinate system, which is determined by X-, Y-, and θ-values. On the alignment stage 8, the work 5 is set substantially in the same position for each occasion, and is conveyed accurately to the same exposing position by the conveyance means 13. Thus, the work 5 and the masks 3 and 4 can be aligned on the alignment stage 8. A first work is transported from the temporary mounting position to the exposing position, and the misalignment is calculated with use of the television cameras 7 working as sensors. Based on the calculated value, specified displacement amounts X and Y and specified angles θ for the positional correction of a next work are calculated, and the tables 9, 10 and 11 are positioned by means of the drive units 15, 16 and 17, respectively. Results of the control are determined by observing the reference marks on the work through the television cameras 18. If the results indicate a misalignment, the position of the work is corrected. In this case, the work in the exposing position, subject to the misalignment, may be returned to the mounting position by the conveyance means 13 so that it is subjected to the positional correction in place of the next work. Otherwise, the work may be discharged into s specific place without being exposed. The aforesaid detection and correction of position may be performed for each of the next work and its successors. If the accuracy of the conveyance means 13 is reproducible, the detection and correction may be performed for each predetermined number of cycles of exposure. In this case, the efficiency of production can be improved. In the exposing position, parallel or approximately parallel beams of light are applied to the work 5, for double-sided exposure thereof, from both upper and lower sides thereof in a manner such that the work 5 and the upper- and lower-surface masks 3 and 4 are situated close to or in intimate contact with one another. When the exposure is finished, the printing frames 2a and 2b are separated, and the work 5 is discharged by the conveyance means 13.

It is to be understood that the present invention is not limited to the embodiment described above, and that various changes and modifications may be effected therein by one skilled in the art without departing from the scope or spirit of the invention. For example, if the alignment stage 8 can be controlled with highly reproducible accuracy, the television cameras 18 may be omitted. Also, the alignment stage must only be able to control the X-, Y-, and $\theta$-values. If unnecessary in view of accuracy, any one of the X-, Y-, and $\theta$-tables may be omitted.

In the simultaneous double-sided exposure unit according to the present invention, as described above, only one alignment mechanism can satisfactorily serve for the alignment of the work and the image masks, as it is located outside the exposing position. Since it need not be moved vertically, moreover, the alignment mechanism can be simplified in construction, thus permitting reduction in cost of the work alignment apparatus. Since the work alignment mechanism of the present invention is disposed outside the exposure position, furthermore, another work can be aligned while one work is being exposed. Thus, the throughput of the apparatus can be improved greatly.

What is claimed is:

1. A work alignment apparatus for double-sided exposure of a work which serves to convey to and locate said work in an exposing position such that said work is exposed on either side thereof between printing frames each holding an image mask on each corresponding side of said work, comprising:

means for detecting and calculating an amount of misalignment between said work in said exposing position and each said image mask;

an alignment stage disposed outside said printing frames and adapted to determine a mounting position of said work in an alignment coordinate system in accordance with said amount of misalignment; and means for conveying said work, in said mounting position determined in said alignment coordinate system, to said exposing position.

* * * * *